United States Patent [19]

Bonazza

[11] Patent Number: 5,089,326
[45] Date of Patent: Feb. 18, 1992

[54] EMI SHIELDED COMPOSITES AND PROCESS OF MAKING SAME

[75] Inventor: Benedict R. Bonazza, Bartlesville, Okla.

[73] Assignee: Phillips Petroleum Company, Bartlesville, Okla.

[21] Appl. No.: 404,381

[22] Filed: Sep. 8, 1989

Related U.S. Application Data

[62] Division of Ser. No. 55,383, May 29, 1987, abandoned.

[51] Int. Cl.$^5$ .......................... B32B 5/06; B32B 9/00; B32B 15/00; B32B 27/00
[52] U.S. Cl. .................... 428/284; 428/285; 428/286; 428/288; 428/297; 428/298; 428/332; 428/337; 428/338; 428/339; 428/408
[58] Field of Search .............. 428/284, 285, 286, 288, 428/408, 297, 298, 332, 337, 338, 339

[56] References Cited

U.S. PATENT DOCUMENTS

| | | | |
|---|---|---|---|
| 4,234,648 | 11/1980 | Patz et al. | 428/260 X |
| 4,474,685 | 10/1984 | Annis | 524/439 X |
| 4,522,890 | 6/1985 | Volkers et al. | 428/624 |
| 4,600,617 | 7/1986 | Cole | 428/252 X |
| 4,643,940 | 2/1987 | Shaw et al. | 428/323 X |
| 4,678,699 | 7/1987 | Kritchevsky | 428/285 X |
| 4,689,098 | 8/1987 | Gaughan | 428/285 X |

OTHER PUBLICATIONS

Modern Plastics, Conductive Fiber Mats As EMI Shield for SMC, May 1982, pp. 68-71.

*Primary Examiner*—Lorraine T. Kendell
*Attorney, Agent, or Firm*—A. W. Umphlett

[57] ABSTRACT

In a polymer composite containing reinforcing fibers, improved EMI shielding is provided by positioning conductive fibers in the composite as discrete, spaced apart layers.

16 Claims, No Drawings

EMI SHIELDED COMPOSITES AND PROCESS OF MAKING SAME

This application is a divisional application of application Ser. No. 07/055,383, filed May 29, 1987, now abandoned.

BACKGROUND OF THE INVENTION

In one aspect, the invention relates to a composition of matter which has been provided with EMI shielding. In another aspect, the invention relates to a process for imparting EMI shielding to a nonconductive substrate sheet or support. In yet another aspect, the invention relates to a method for improving the shielding capability of a given quantity of EMI shielding material.

For many applications, it is desirable to provide finished parts with electromagnetic interference (EMI) shielding characteristics. In the automotive field, EMI shielding is required for plastic hoods, fenders, and firewalls. Office business machines require some form of shielding over parts of their internal areas. By regulation, emissions from all digital computing devices must be within certain radiation limits. Regulation of emissions is necessary because of increasing complaints of electrical malfunctions caused by electromagnetic interference. Examples include TV interference, flight instrument malfunctions caused by pocket calculators and activation of electrically controlled devices by citizens band radios.

Several methods are known for providing EMI shielding of electronic components. Presently known methods include silver paint application, nickel paint application, conductive filler utilization, silver reduction, cathode sputtering, foil application, copper paint, vacuum metalizing, electroplating, flame/arc spraying and graphite paint application. With the exception of conductively filled plastics, all of the shielding methods suffer from either a limited life due to chipping, cracking, peeling or they involve costly secondary operations.

The most desirable method of providing shielding is with conductively filled plastics because the shielding material is an integral part of the plastic and will not chip or blister and does not require secondary operations to apply. A problem is that incorporating conductive fillings into plastics frequently reduces product properties to an unacceptable extent because of the high amount of filler required to provide acceptably high shielding characteristics and the relatively low reinforcing characteristics of most fillers. It would clearly be desirable to provide a technique so that acceptable shielding is obtainable with lower amounts of filler and the filler imparts good reinforcement to the part.

OBJECTS OF THE INVENTION

It is an object of this invention to provide a composition of matter which provides good EMI shielding.

It is another object of this invention to provide a laminated or molded article having good EMI shielding.

It is a further object of this invention to provide a process for imparting EMI shielding to a nonconductive support or improving the EMI shielding of a carbon fiber reinforced support.

It is an additional object of this invention to provide a method for improving the shielding capability obtainable from a given quantity of conductive filler.

STATEMENT OF THE INVENTION

In a first embodiment of the invention, a composition is provided which comprises a support having a first surface and a second surface, with the first surface and the second surface being juxtaposed with respect to each other. A first layer of conductive fiber is carried on the first surface. A second layer of conductive fiber is carried on the second surface. By separating the layers of conductive fiber by the support, the shielding effectiveness of the fiber is increased over where the layers are placed in a contacting relationship or the fibers are dispersed throughout the composition. By increasing the effectiveness of the conductive fiber, adequate shielding can be provided with lower levels of the conductive fiber and a greater amount of more highly reinforcing fiber can be utilized. The invention thus provides a technique for providing EMI shielded laminated articles with more strength or higher shielding, as desired.

In another embodiment of the invention, there is provided a process for imparting EMI shielding to a substrate sheet having a first surface juxtaposed from a second surface. The substrate sheet serves as a support. The process comprises adhering a first sheet containing conductive fiber of aspect ratio greater than about 20 to the first surface of the substrate sheet and adhering a second sheet containing conductive fiber of aspect ratio greater than about 20 to the second surface of the substrate sheet. By providing the layers of conductive fiber impregnated in prepreg sheets such as those having a polymer matrix, the required degree of EMI shielding in the finished part can be readily adjusted by increasing or decreasing the number of EMI shielding sheets used. The fininshed product is in the form of a laminated article. The process can readily be carried out in a compression molding process as is commonly employed in the industry. In such case, the EMI shielding sheets can be conveniently provided in the form of thermoplastic prepregs.

In a still further aspect of the invention, there is provided a method for improving the shielding capability that a given quantity of conductive fiber can impart to an article comprising a nonconductive matrix which contains these conductive fibers. The method comprises positioning the conductive fiber in a plurarily of discrete juxtaposed layers in the matrix. Data in the following specification indicates that positioning the conductive fiber in discrete juxtaposed layers increases the shielding effectiveness of the fiber. Therefore, the required degree of shielding can be obtained by using a lesser amount of the conductive fiber. As makeup for the omitted conductive fiber, highly reinforcing fiber such as glass fiber as carbon fiber can be incorporated into the matrix to provide EMI shielded articles having high strength.

DETAILED DESCRIPTION OF THE INVENTION

One objective of the invention is to provide EMI shielding in a nonconductive material otherwise lacking same. Another objective is to provide a technique for easily adjusting the EMI shielding provided to an article. A convenient technique for adding and/or adjusting EMI shielding would be desirable for materials which will be laid up or thermoformed into articles in which EMI shielding is required. Such materials include polymers, which can be of the thermoset or the thermoplastic variety. Preferably, the invention is utilized in conjunction with thermoplastic polymers because it is generally cheaper to fabricate articles from thermoplastic polymers. Polyethylene, polypropylene and polyester resins are believed to be highly suitable thermoplastic polymers to use with the invention where high performance properties are not required. Other suitable polymer resins include polystyrene, ABS, other acrylic polymers and copolymers, polyethers, polyamides, PVC, polycarbonates, epoxy resins, phenolic resins, melamines and polyarylene sulfides such as polyphenylene sulfide, polyphenylene sulfide sulfone, polyphenylene sulfide ketone, and other aromatic thermoplastics such as polyphenylene ether ketone, polyphenylene ether polyphenysulfone and the like.

The nonconductive material can be used as a support for the layers of conductive fiber. Preferably, a reinforcing fiber is present in the support to provide for greater strength. Suitable fibers to reinforce a resin matrix are well known. Glass fibers, carbon fibers, aramid fibers and the like are preferred, although the support can also be reinforced with natural organic fibers such as jute or hemp if desired. Preferred fibers are non-metallic and non-metallized. Reinforced supports are usually in the form of one or more plys of fiber reinforced polymer matrix, usually laminated together with the fiber reinforcment therein extending in several directions. However, the invention is applicable to supports containing substantially unidirectional fiber reinforcement as well.

The thickness of the support depends on its strength and the desired strength requirements of the article. Where the support contains long fiber reinforcement it can generally be made thinner than in the case where short fiber reinforcement or no reinforcement at all is present. As a broad range, the thickness of the support will generally range from about 0.001 inches to about 10 inches or so, usually in the range of from about 0.01 inches to about 0.5 inches, and preferably in the range of from about 0.02 to about 0.2 inches. Supports having a wide range of thickness are rather easily formed from thermoplastic such as poly(arylene sulfide) and can be easily postformed as well.

Where reinforcing fibers are used in the support, they can be of any desired length. Where the support is injection molded, the fibers will generally have a short length, usually ¼ inch or less. For stamp molded supports, fiber lengths in the range of about ¼ inch to 4 inches and longer are highly suitable. The reinforcing fiber can be present in the form of a mat, fabric or unidirectional tape if desired, and the fiber can be continuous. One technique for forming suitable supports easily adapted to a continuous line is to sandwich the reinforcing fiber between films of the desired polymer and subject the combination to sufficiently elevated conditions of temperature and pressure to consolidate the materials and form the support. To form reinforced supports from thermosetting materials, the reinforcing material selected can be drawn through a bath of the thermosetting resin, withdrawn, and allowed to partially cure.

In accordance with one embodiment of the invention, a support is provided with layers of conductive fibers carried on opposed surfaces or faces of the support. The conductive fibers can be positioned on the surfaces of the support in any suitable manner. Preferably, the surfaces upon which the conductive fibers are positioned are juxtaposed. In a preferred embodiment of the invention, the conductive fibers are carried in continuous polymer matrices in the form of sheets, preferably prepreg sheets which were formed separately from the support. The polymer matrix of each such sheet can be thermoset or thermoplastic. Preferably, the polymer matrix is thermoplastic and is of the same type of thermoplastic as the support. In such a case, the sheets carrying the conductive fibers can be laminated onto the support by the application of adequate heat and pressure to form a laminated article in which the support and the sheets carrying the layers of conductive fibers are in the form of plys. Adhesive materials may also be used to form the laminated articles.

The plys which can carry the conductive fibers will generally be spaced apart by the thickness of the support, which, as mentioned hereinabove, is usually between about 0.01 inches and about 0.5 inches. The thickness of each conductive fiber ply generally, will range from about 0.0005 inches to about 0.5 inches, usually in the range of from about 0.001 inches to about 0.2 inches, and preferably from about 0.005 to about 0.050 inches where the sheet contains a thermoplastic resin matrix, to facilitate utilizing the conductive fiber sheets of the invention in thermoforming processes.

For reasons of conductivity, costs and final product strength, it is important that the conductive fibers used in the invention have a high aspect ratio. The aspect ratio of the fibers is defined as the ratio between fiber length and fiber diameter. EMI shielding effectiveness increases with increasing aspect ratio. By utilizing conductive fibers having a high aspect ratio, smaller amounts of conductive fibers can be used to provide an equivalent level of EMI shielding. Since there is an upper limit to the amount of total fiber, both conductive and nonconductive, that can be added to a polymer matrix with good results, the invention makes possible utilizing a higher level of reinforcing fiber in the article to provide greater strength. Preferably, the aspect ratio of the conductive fibers is greater than about 20, and more preferably greater than about 50.

The layers which carry the conductive fiber generally range from about 10 to about 60 weight percent of conductive fiber, based on weight of layer or ply including the conductive fiber. Usually, the conductive layer will comprise conductive fiber in an amount in the range of about 15 weight percent to about 50 weight percent, based on weight of ply. The conductive plys can also contain reinforcing fiber in addition to the conductive fiber, up to incorporation limits.

The fiber content of layers or plys which do not contain a substantial amount of conductive fiber can vary over a wide range. For high performance properties, in the range of from about 30 weight percent to about 80 weight percent of each ply not containing a substantial amount of conductive fiber can comprise reinforcing fiber. For many other applications, the fiber content of the layers which do not contain a substantial amount of the conductive fiber can range from about 20 weight percent to about 60 weight percent of reinforcing fiber for adequate properties. Continuous reinforcing fibers are preferred for high performance composites.

Both the conductive and the reinforcing fibers can be incorporated into the polymer in a variety of forms. However, the conductive fiber should be positioned so that the conductive fibers contact one another to form a conductive network throughout the ply which forms the conductive layer. The fibers can be present in the form of random fibers, mats, fabrics, meshes, and tapes, for example. For economy and high aspect ratio, the conductive fiber should be of relatively small diameter, preferably in the range of 0.001 to 0.1 millimeter. The length of the conductive fiber will generally range from 1 millimeter to a continuous strand. Preferably the conductive fibers have a length of greater than about 1 centimeter to provide the desired high aspect ratio and thus good effectiveness for EMI shielding. Continuous strands or wires of the conductive fiber can be used with good results.

To provide good EMI shielding, it is important that sufficient amount of the conductive fibers be positioned in each conductive layer so that a conductive network is formed. These layers will generally each provide a screen or mesh on top of the support with "holes" in the screen up to about a square millimeter in size, where 30 to 1000 MHz is to be shielded. Where different wavelengths are to be shielded, the "holes" or gaps in the fiber network should have a largest dimension on the order of less than one fourth the shortest wavelength to be shielded.

The conductive fibers used in the invention are preferably metal-containing and are formed from ductile conductive metals or metal alloys, or metallized or metal-coated fibers. The conductive fibers are preferably those characterized as metal-containing fibers. Most metals which can be used for electrical conductors are suitable, such as for example, aluminum, copper, silver, gold or nickel. Other metals, such as tin and lead are also expected to work well, provided that the resin selected for the matrix does not interact with the metal selected, such as by corrosion. Nickel coated carbon fiber has been tested with good results.

The discovery upon which the present invention is based is that dividing a given quantity of conductive fiber into a plurality of discrete juxtaposed layers separated by nonconductive matrix will increase the shielding effectiveness of the fiber. The invention is easily applied to laminates by positioning layers containing conductive fibers on each side of a nonconductive ply, thereby obtaining a greater degree of shielding that would be the case where the same amount of conductive fibers were dispersed throughout the article or positioned in adjacent layers on the article, or all in the same layer. In a preferred embodiment of the invention, prepreg sheets containing the conductive fibers are laminated onto nonconductive substrates, in the number desired to obtain the desired degree of EMI shielding. It is important for best results in this embodiment of the invention that the plys containing the conductive fiber be positioned in at least two spaced apart plys which are separated by at least one ply which does not contain a substantial amount of conductive fiber. Where the matrix of each ply comprises a thermoplastic matrix, the composite article resulting from application of the invention can be in any desired form, or it can be post-formed into any desired form by the application of suitable heat and pressure.

A preferred resin for use in the invention comprises a poly(arylene sulfide) resin because the invention has been tested with polyphenylene sulfide with good results.

Carbon fibers can be used as reinforcing fibers or conductive fibers in accordance with the invention. When the carbon fibers are used as reinforcing fibers, a metal or metallized fiber is used as the conductive fiber. When the carbon fiber is used as the conductive fiber, a nonmetallic reinforcing fiber such as glass or aramid may be used in the support. Thus, in one aspect of the invention, a glass or aramid reinforced support can be provided with a greater degree of EMI shielding by being sandwiched between layers containing carbon fiber reinforcement.

The invention is illustrated by the following examples.

EXAMPLE I

This Example shows a conductive prepreg composed of Ryton polyphenylene sulfide resin and a metal web. Since no reinforcement other than the metal web is present, it is recommended that this product be used in conjunction with glass or Kevlar reinforced Ryton composites to form the finished part.

The metal web prepreg was formed by sandwiching a layer of 0.3 gm/in$^2$ Fibrex nickel web from National Standard Co. between two layers of 10 mil (0.010") thick Ryton PPS film. This layup was placed between ⅛" thick metal platens with teflon release cloth between the film and metal platens to prevent sticking. The layup was placed in a platen press heated to 600°–625° F. Contact pressure was applied for 2 min. then the pressure was increased to 100 psi and held for 1–2 min. After relief of the pressure, the layup was quickly transferred to a cooling press with platens at 50°–80° F. and held at 100 psi for 1–2 min. to prevent warpage. This procedure provided a nickel web prepreg containing approximately 40 weight percent nickel fibers and 60 weight percent Ryton PPS.

TABLE I

|  | Property |
| --- | --- |
| Fiber Type | Nickel Web |
| Fiber Content, wt. % | 40 |
| Fiber Length, in. | 0.5–1.5 |
| Nominal Fiber Diameter, um | 20 |
| Sheet Thickness, in. | 0.025 |
| Color | Black |
| Density, g/cc | 2.02 |

This prepreg can be laminated, by basically the same procedure as that described for making the prepreg, onto unidirectional or fabric materials and subsequently thermoformed to give the desired part shape. Ryton materials are thermoformed at 600°–625° F. and low pressures (10–100 psi). It is a convenient route to providing a high level of EMI shielding to thermoformed parts.

TABLE II

| | | Frequency[1], MHz | | | |
| --- | --- | --- | --- | --- | --- |
| Run # | Construction[2] | 30 | 100 | 300 | 1,000 |
| 1 | 1 sheet prepreg in center | 93 | 86 | 97 | 84 |
| 2 | 2 sheets prepreg in center | 98 | 90 | 86 | 72 |
| 3 | 3 sheets prepreg in center | >100 | 95 | 95 | 88 |
| 4 | 1 sheet prepreg on each side | >100 | 100 | 101 | 101 |

[1]Shielding effectiveness was determined by the ASTM ES-7 Dual Chamber Method.
[2]Remainder of 3" × 6" × ⅛" test specimen is AG20-40, a nonconductive PPS/Glass composite material.

Run 4 clearly shows the benefits of separating the prepreg sheets in the composite product.

EXAMPLE II

This Example shows Ryton polyphenylene sulfide prepreg reinforced with a chopped mat containing metal coated carbon fibers. This resin/reinforcement combination provides a material with increased conductivity over normal carbon fiber composites, and also provides good mechanical properties and convenient processability. The high conductivity of the prepreg makes it an ideal candidate for EMI shielding applications. In preparing this prepreg, nickel coated carbon fiber chopped mat from International Paper was sandwiched between two sheets of 2 mil PPS film. The process was similar to that described in example I.

TABLE III

|  | Property |
|---|---|
| Fiber Type | Nickel Coated Carbon |
| Fiber Mat Construction | 1" Chopped |
| Fiber Content, wt. % | 20 |
| Sheet Thickness, in. | 0.008 |
| Color | Black |
| Density, g/cc | 1.50 |
| Tensile (ASTM Method D 3009) | |
| Strength, KSI | 14.5 |
| Modulus, MSI | 1.22 |
| Elongation, % | 1.5 |
| Flexural (ASTM Method D790) | |
| Strength, KSI | 22.9 |
| Modulus, MSI | 1.17 |
| Izod Impact, ft-lb/in. (ASTM Method D256) | |
| Notched | 1.54 |
| Unnotched | 4.96 |

The prepreg illustrated by Table III is intended for use in stamp molding or rapid compression molding operations. The one inch long fibers provide a high aspect ratio material with excellent flow characteristics permitting good fill out of thin-walled, deep draw parts. Since fiber and resin flow together during molding, a homogeneous part with good shielding characteristics is obtained.

Electronic housings or enclosures and antenna bases requiring high levels of EMI shielding can be readily stamp molded from this prepreg material. Inserts can be readily incorporated into the part during the molding operation.

TABLE IV

| Run # | Construction[2] | Frequency[1], MHz | | | |
|---|---|---|---|---|---|
| | | 30 | 100 | 300 | 1,000 |
| 1 | 1 sheet prepreg ACN10-20 in center | 58 | 50 | 51 | 44 |
| 2 | 2 sheets prepreg ACN10-20 in center | 66 | 61 | 59 | 48 |
| 3 | 3 sheets prepreg ACN10-20 in center | 66 | 60 | 59 | 52 |
| 4 | 4 sheets prepreg ACN10-20 in center | 64 | 58 | 57 | 50 |
| 5 | 2 sheets prepreg ACN10-20 on each side | >100 | 99 | 101 | 84 |
| 6 | 100% prepreg ACN10-20 | >69 | >80 | >91 | >71 |

[1]Shielding effectiveness was determined by the ASTM ES-7 Dual Chamber Method.
[2]Remainder of 3" × 6" × ⅛" test specimen is AG20-40, a nonconductive PPS/Glass composite material.

Table IV clearly illustrates the benefits of separating the layers of metallized fibers in the composite product. That which is claimed is:

1. An electromagnetic interference (EMI) shielded composite comprising:
   (a) a support having a first surface and a second surface, said first surface being separated by said support from said second surface;
   (b) a first layer of conductive fibers in a continuous polymer matrix laminated to said first surface said conductive fibers having an aspect ratio sufficiently high in relation to the amount of fibers present to provide EMI shielding; and
   (c) a second layer of conductive fibers in a continuous polymer matrix laminated to said second surface said conductive fibers having an aspect ratio sufficiently high in relation to the amount of fibers present to provide EMI shielding.

2. A composite as in claim 1 wherein the support comprises a nonconductive matrix and a distance in the range of about 0.001 inch to about 10 inches separates the first surface from the second surface.

3. A composite as in claim 2 wherein the support comprises a polymer selected from the group consisting of a thermoset polymer and a thermoplastic polymer and the conductive fibers are selected from the group consisting of metal fibers and metal coated fiber.

4. A composite as in claim 3 further characterized as a plurality of laminated plys, wherein the support is formed from at least one ply of polymer reinforced with nonconductive fibers, wherein each of the first surface comprising of conductive fibers and second surface comprising conductive fibers is formed from at least one ply comprising conductive fibers fiber in a continuous polymer matrix.

5. A composite as in claim 4 wherein a distance of at least 0.01 inches separates the first layer of conductive fibers from the second layer of conductive fibers.

6. A composite as in claim 5 wherein a distance of at least 0.5 inches separates the first layer from the second layer.

7. A composite as in claim 1 wherein the support comprises a nonmetallic fiber reinforcement and the conductive fibers comprise carbon fibers.

8. A composite as in claim 5 wherein each polymer comprises a thermoplastic polymer.

9. A composite as in claim 8 wherein the thermoplastic polymer comprises a poly(arylene sulfide) polymer.

10. A composite as in claim 9 wherein the conductive fibers comprise metal coated fibers, and said at least one ply which contains said metal coated fibers has a thickness in the range of about 0.005 inches to about 0.1 inches.

11. A composite as in claim 10 wherein the conductive fibers comprises metal coated carbon fibers and the fibers in the support comprises carbon fiber.

12. A composite as in claim 10 wherein the metal coated fibers has an aspect ratio, on average, of at least 50.

13. A composite as in claim 11 wherein the conductive fibers comprise solid metal fibers, and each ply which contains said metal fiber have a thickness in the range of about 0.005 inches to about 0.1 inches.

14. A composite as in claim 13 wherein the metal fibers has an aspect ratio, on average, of greater than about 50.

15. A composite as in claim 13 wherein the shielding effectiveness is over 100 dB over the range 30 to 1000 MHz as measured by ASTM ES-7, Dual Chamber Method.

16. A composite as in claim 11 wherein the composition has a shielding effectiveness of over 80 dB over the range of 30 to 1000 MHz as measured by ASTM ES-7, Dual Chamber Method.

* * * * *